United States Patent [19]

Sheng

[11] Patent Number: 5,753,552
[45] Date of Patent: May 19, 1998

[54] METHOD FOR FABRICATING A STORAGE ELECTRODE WITHOUT POLYSILICON BRIDGE AND UNDERCUT

[75] Inventor: Yi-Chung Sheng, Taichung, Taiwan

[73] Assignee: United Microelectronics Corporation, Taipei, Taiwan

[21] Appl. No.: 790,793

[22] Filed: Jan. 30, 1997

[51] Int. Cl.$^6$ ............................................. H01L 21/8242
[52] U.S. Cl. ...................... 438/253; 438/256; 438/396
[58] Field of Search ............................ 437/47, 48, 52, 437/60, 919; 438/253, 256, 210, 329, 399, 396

[56] References Cited

U.S. PATENT DOCUMENTS

| | | | |
|---|---|---|---|
| 5,312,769 | 5/1994 | Matsuo et al. | 437/52 |
| 5,385,863 | 1/1995 | Tatsumi et al. | 437/109 |
| 5,591,664 | 1/1997 | Wang et al. | 437/60 |
| 5,618,747 | 4/1997 | Lou | 438/398 |

OTHER PUBLICATIONS

S. Wolf and R.N. Tauber, "Silicon Processing for the VLSI Era vol. 1—Process Technology," Lattic Press, 1986, pp. 166–167.

Primary Examiner—John Niebling
Assistant Examiner—Joni Y. Chang
Attorney, Agent, or Firm—Cushman Darby & Cushman IP Group of Pillsbury Madison & Sutro LLP

[57] ABSTRACT

A method for fabricating a storage electrode is designed to avoid the problems of polysilicon bridge and undercut. First, a substrate having a transistor is provided. An insulating layer is then deposited over the substrate. A contact hole is then formed in the insulating layer down to the source/drain region of the transistor. A thin polysilicon layer is then deposited and further patterned at least at the periphery of the contact hole and on the upper surface of the source/drain region. Finally, an anisotropical epitaxial polysilicon layer is formed on the upper surface of the first polysilicon layer.

9 Claims, 6 Drawing Sheets

METHOD FOR FABRICATING A STORAGE ELECTRODE WITHOUT POLYSILICON BRIDGE AND UNDERCUT

BACKGROUND OF THE INVENTION

1. Field of the Invention

The invention relates to a method of fabricating a semiconductor memory device and is especially related to a method of fabricating a storage electrode of a dynamic random access memory (DRAM) device.

2. Description of the Related Art

The development of manufacturing techniques for semiconductor elements has promoted the development of DRAMs of high capacitance as semiconductor memory elements. Therefore, a thickness of the storage electrode is usually more than 4000 Å so as to supply sufficient capacitance. However, since the polysilicon layer for a storage electrode is thick, it is difficult to clearly etch away the polysilicon layer between two predetermined storage electrodes during the pattern process of the storage electrode. The polysilicon remaining between two storage electrodes is termed as "polysilicon bridge". One conventional solution for removing the polysilicon bridge is to take extra over-etching time. However, it is not economic and, thus, tends to reduce throughput.

FIG. 1A through FIG. 1C illustrate a conventional process flow of fabricating a storage electrode. Referring to FIG. 1A, at least one transistor is formed at an active region on a substrate 20. The active region is a portion of the surface of the substrate 20 surrounded by field oxide layers 22. The field oxide 22 is formed by a local oxidation process (LOCOS). A certain portion of the surface of the substrate 20 is oxidized to become a field oxide layer 22. The transistor at the active region includes a gate oxide layer 24, a gate 26 and source/drain regions 28. A spacer 30, preferably made of silicon oxide, is further formed on the sidewall of the gate 26. A cap oxide 32, preferably made of silicon oxide, can be formed on the upper surface of the gate 26. An insulating layer 34, for (example, a silicon oxide layer, is formed, using for example chemical vapor deposition (CVD) over the substrate 20. The insulating layer 34 is then etched to form a contact hole 36 which exposes one of the source/drain regions 28, using a conventional photolithography and etching technique. A polysilicon layer 18, having a thickness of about 4000 Å, is formed over the substrate 20, using CVD. Ions can be implanted into the polysilicon layer 18 to increase the conductivity.

Referring to FIG. 1B, the polysilicon layer 18 is patterned, such as using etching, to form a polysilicon layer 18a. Due to the fact that the polysilicon layer 18 is thick, the polysilicon between two adjacent storage electrodes is hard to remove completely. Therefore, the remaining polysilicon layer 18a1 tends to form a "polysilicon bridge" between two adjacent storage capacitor.

For solving these problems, an etching technique with a flush recipe has been proposed. Even though this etching technique with a flush recipe shortens the over-etching period, another problem comes thereafter, an undercut 19 of the storage electrode, as shown in FIG. 1C, and substrate damage; here, FIG. 1C is a cross-sectional view orthogonal to FIG. 1B.

SUMMARY OF THE INVENTION

It is therefore an object of the invention to provide a method for fabricating a storage electrode without the problems of polysilicon bridge and undercut.

A substrate is provided. A transistor having a source/drain region is formed on the substrate, wherein the source/drain region is doped with first type ions. An insulating layer is formed over the substrate. A portion of the insulating layer is removed to form a contact hole which exposes the upper surface of the source/drain region. A first polysilicon layer is formed at least at the periphery of the contact hole and on the upper surface of the source/drain region. A second polysilicon layer is formed on the upper surface of the first polysilicon layer, using an anisotropical silicon selective growth technique.

BRIEF DESCRIPTION OF THE DRAWINGS

Other objects, features, and advantages of the invention will become apparent from the following detailed description of the preferred but non-limiting embodiment. The description is made with reference to the accompanying drawings in which:

FIG. 1B is orthogonal to that of FIG. 1C.

DESCRIPTION OF THE PREFERRED EMBODIMENT

Figure 1A:
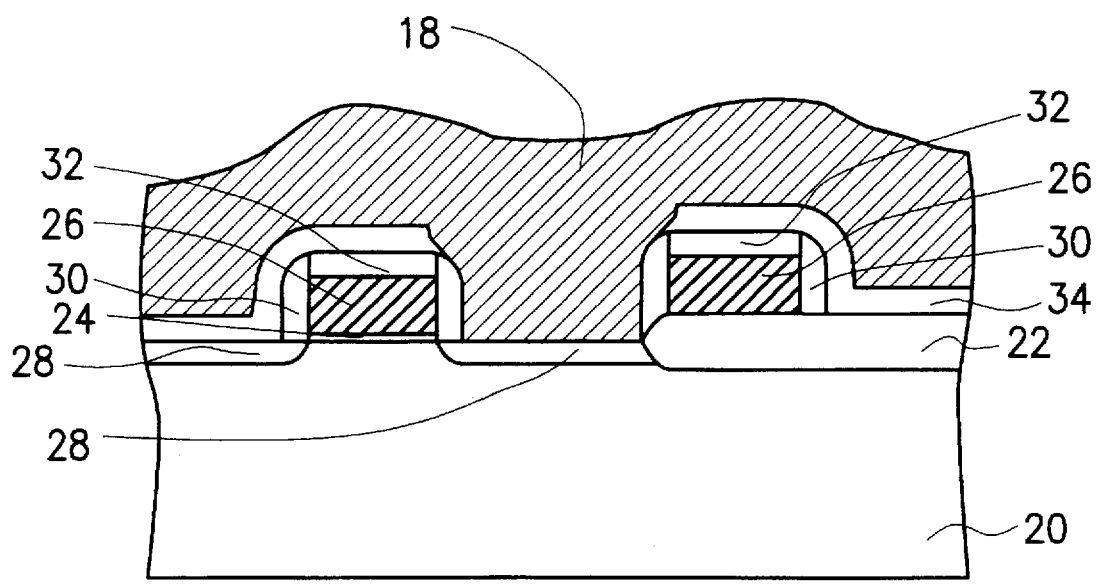
FIG. 1A through FIG. 1C are the cross-sectional views showing the conventional process steps of fabricating a storage electrode. The section direction of FIG. 1A
Figure 1B:
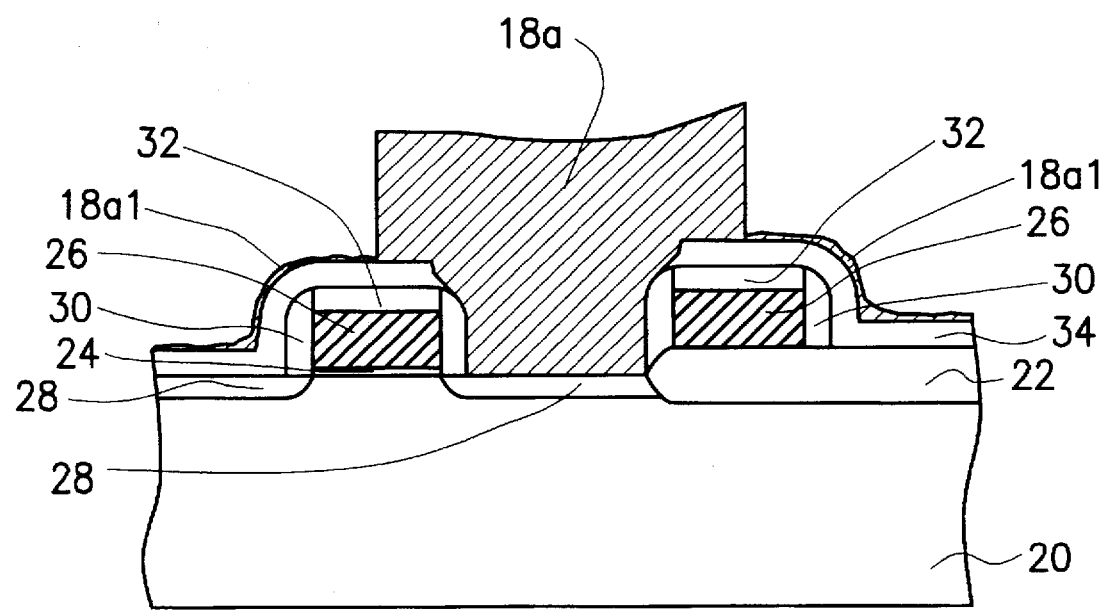
Figure 1C:
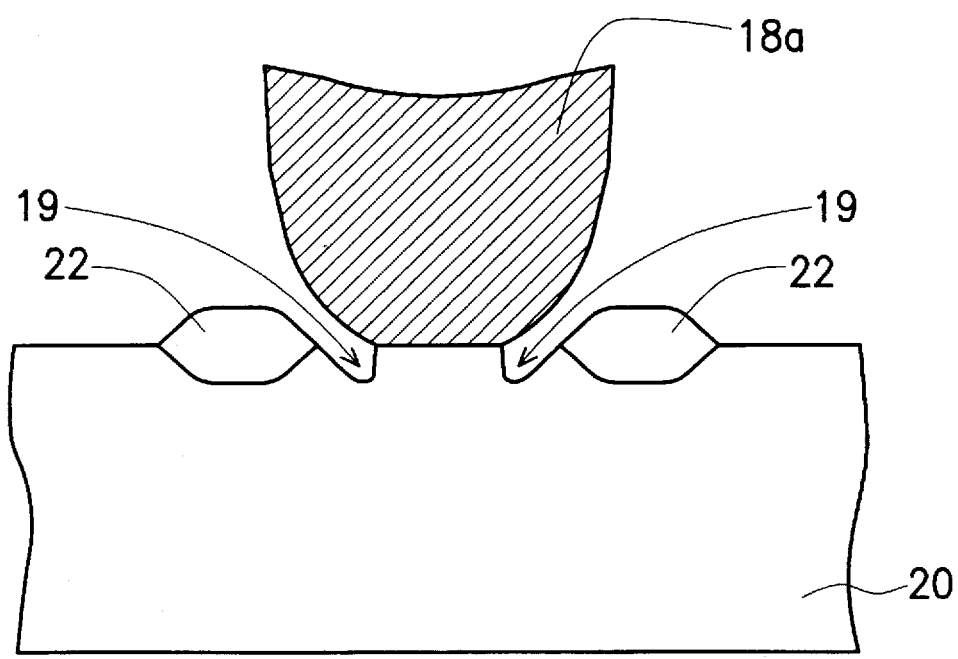
Figure 2A:
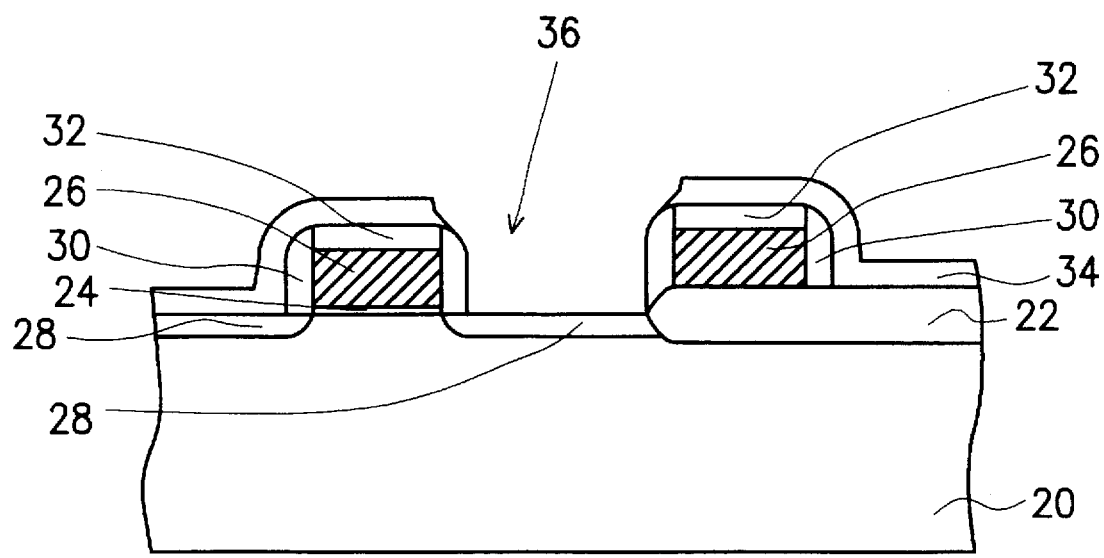
FIG. 2A through FIG. 2D are the cross-sectional views showing process steps of fabricating a storage electrode according to a preferred embodiment of the invention.

Referring to FIG. 2A, at least one transistor is formed at an active region on a substrate 20. The active region is a portion of the surface of the substrate 20 surrounded by field oxide layers 22. The field oxide 22 is formed by a local oxidation process (LOCOS). A certain portion of the surface of the substrate 20 is oxidized to become a field oxide layer 22. The transistor at the active region includes a gate oxide layer 24, a gate 26 and source/drain regions 28. A spacer 30, preferably made of silicon oxide, is further formed on the sidewall of the gate 26. A cap oxide 32, preferably made of silicon oxide, can be formed on the upper surface of the gate 26. An insulating layer 34, for example, a silicon oxide layer, is formed, using such as CVD over the substrate 20. The insulating layer 34 is then etched to form a contact hole 36 which exposes one of the source/drain regions 28, using a conventional photolithography and etching technique.

Figure 2B:
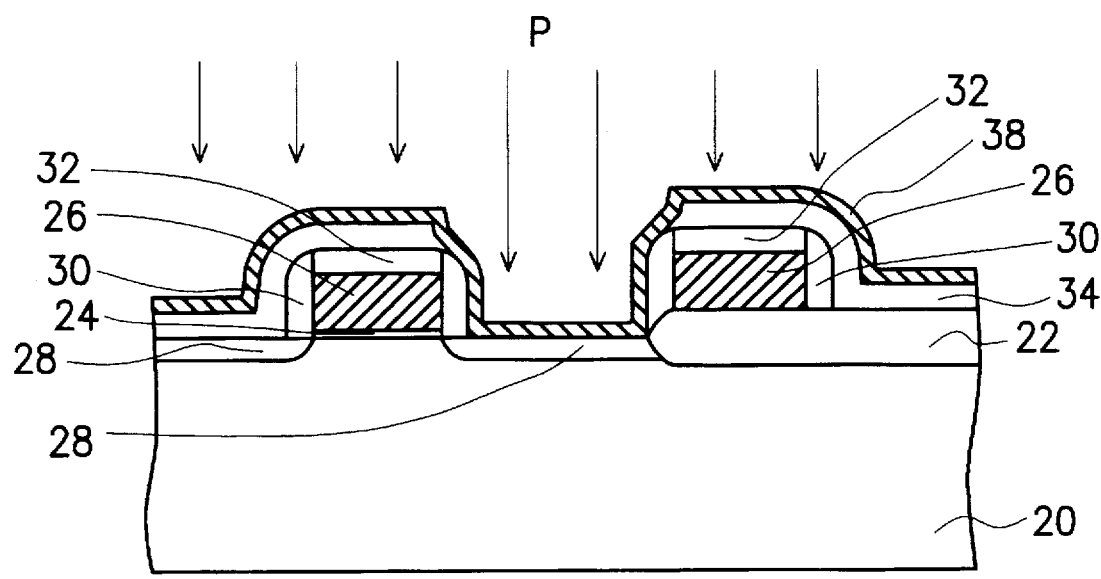
Figure 3A:
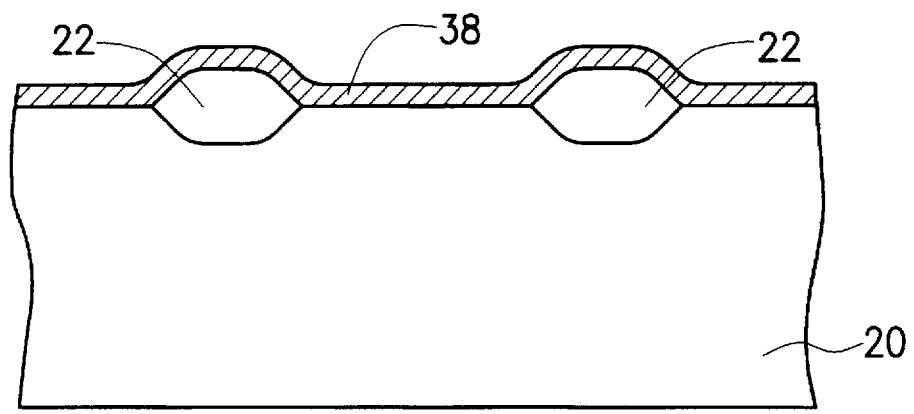
FIG. 3A through FIG. 3C are the cross-sectional views from a direction orthogonal to that of FIG. 2B through FIG. 1D.

Referring to FIG. 2B and FIG. 3A, a thin polysilicon layer 38 is formed, preferably using CVD, over the substrate 20. Therefore, at least the insulating layer 34 and the contact hole 36 are covered by the polysilicon layer 38. The polysilicon layer 38 can, for example, have a thickness of about 300~500 Å. Ions can be implanted into the polysilicon layer 38 at an energy level of about 30~50 KeV, with a dosage of about $1\times10^{15}$ cm$^{-2}$ to $3\times10^{15}$ cm$^{-2}$. Ions are preferably phosphorous if the transistor is a N-type metal oxide semiconductor (MOS). On the other hand, borons are preferable implanted ions if the transistor is a P-type MOS.

Figure 2C:
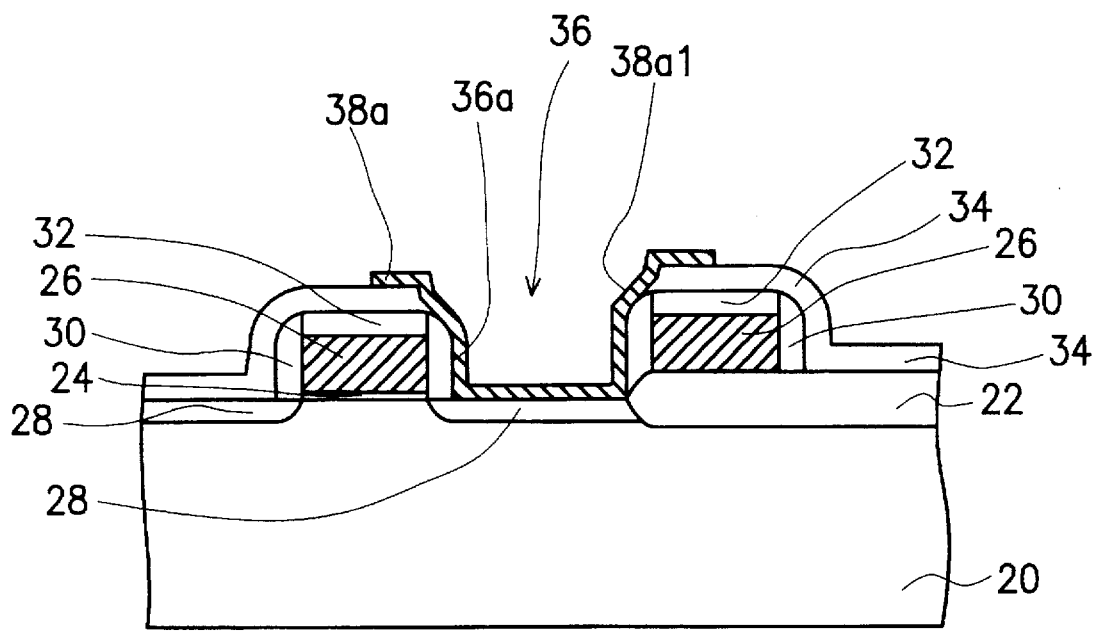
Figure 3B:
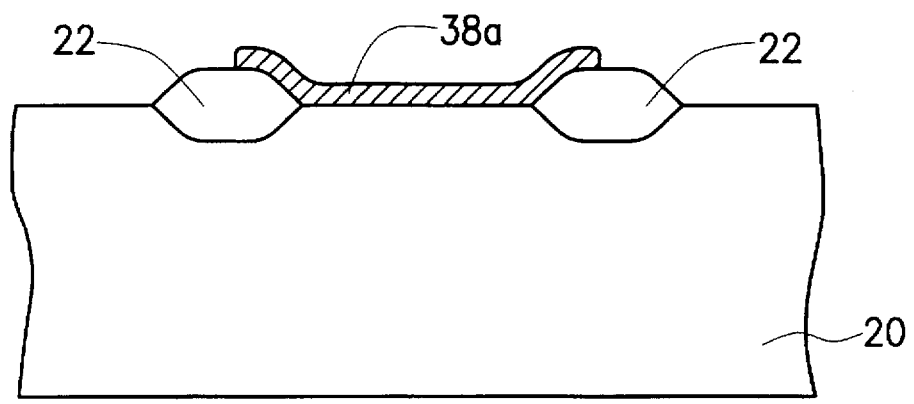

Referring to FIG. 2C and FIG. 3B, the polysilicon layer 38 is patterned to become a polysilicon layer 38a at least at the periphery 36a of the contact hole 36, using a conventional photolithography and etching technique. The etching technique can be either dry etching with flush recipe or dry etching without flush recipe. The polysilicon layer 38a can also extend on to the insulating layer 34. Since the polysilicon layer 38 is thin, it is easy to be patterned without any polysilicon bridge and undercut.

Figure 2D:
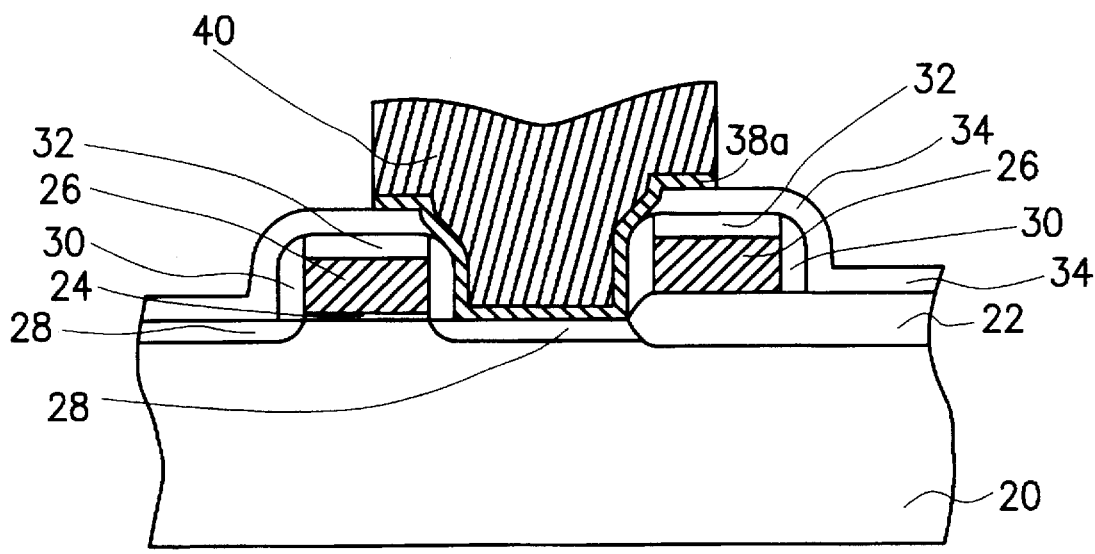
Figure 3C:
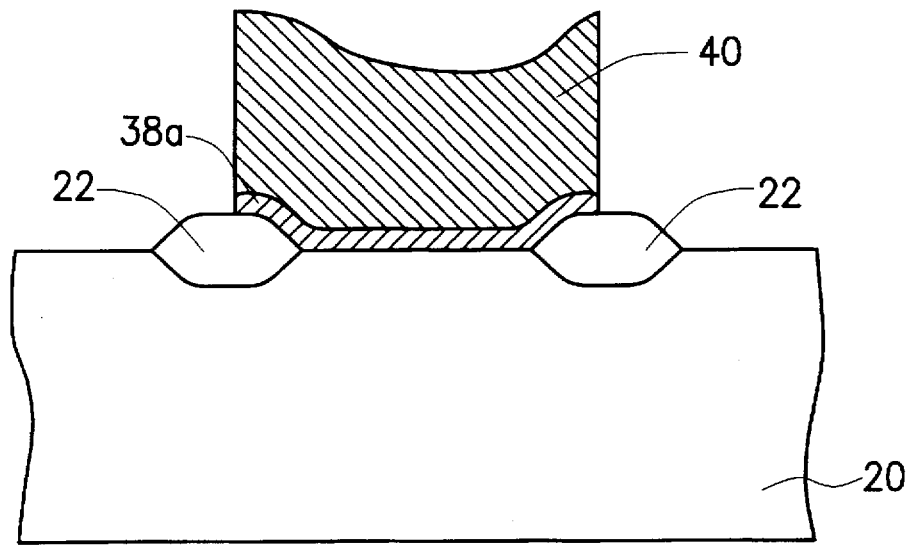

Referring to FIG. 2D and FIG. 3C, in order to apply the selective growth of silicon to the upper surface 38a1 of the polysilicon layer 38a, an anisotropical silicon selective growth technique is used. A cold wall ultra-high vacuum chemical vapor deposition (UHV-CVD) system is used for anisotropic epitaxial growth. The base pressure is $8\times10^{-10}$ Torr. In order to reduce the deposition temperature, $Si_2H_6$ is used instead of $SiH_4$, so that this system can selectively deposit Si 40 on the upper surface 38a1 of the polysilicon layer 38a under 700° C., which prevents dopant diffusion. $Si_2H_6$ and $PH_3$ gases were introduced to deposit phosphorous doped silicon, where the phosphorous concentration is about $4\times10^{19}$ cm$^{-3}$ to $5-10^{19}$ cm$^{-3}$ as the polysilicon layer 38a is doped with phosphorous. The growth rate is about 50 to 60 nm/min at 700° C., where the $Si_2H_6$ flow rate is 1 sccm and the total pressure is $1\times10^{-3}$ Torr. Anisotropic epitaxial growth is achieved by decreasing surface hydrogen, which is introduced from $Si_2H_6$ source gas.

It is clear for the people skilled in this art that the thickness of the anisotropic selective epitaxial silicon 40 can be adjusted by the growing time. Moreover, the method according to the invention protects a storage electrode from the problem of polysilicon bridge and undercut.

Figure 4:
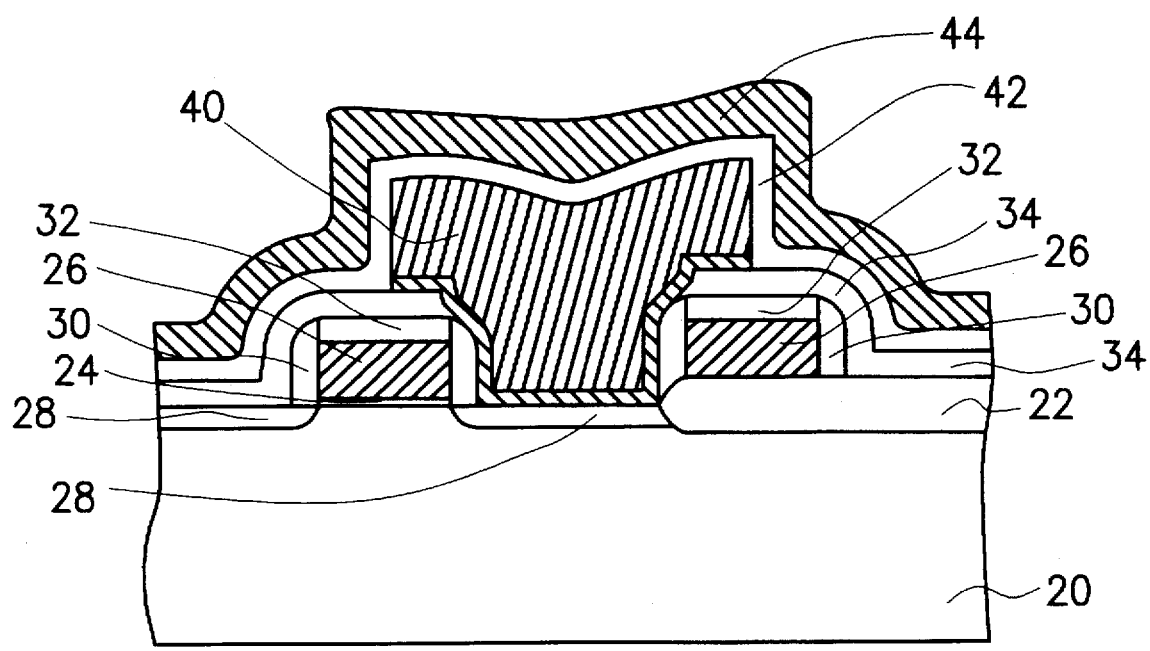
FIG. 4 is a cross-sectional view showing a storage capacitor according a preferred embodiment of the invention.

A storage electrode can be completed by the above-mentioned processes. However, to further fabricate a complete storage capacitor, several further process steps should be performed. Referring to FIG. 4, a dielectric layer 42 can be formed over the anisotropic selective epitaxial silicon 40. The dielectric layer 42 can be a silicon oxide layer, a silicon nitride layer, a NO (silicon nitride/silicon oxide ) layer or a ONO (silicon oxide/silicon nitride/silicon oxide) layer. A polysilicon layer 44, having a thickness of about 1000 Å, is then deposited over the dielectric layer 42 to form an upper electrode. The upper electrode 44 and the storage electrode consisting of the anisotropic selective epitaxial silicon 40 and the polysilicon layer 38a together form a complete capacitor.

While the invention has been described by way of example and in terms of a preferred embodiment, it is to be understood that the invention is not limited thereto. To the contrary, it is intended to cover various modifications and similar arrangements. The appended claims, therefore, should be accorded the broadest interpretation so as to encompass all such modifications and similar arrangements.

What is claimed is:

1. A method of fabricating a storage electrode, comprising the steps of:

providing a substrate, on which a transistor having a source/drain region is formed, wherein the source/drain region is doped with first conductivity type ions;

forming an insulating layer over the substrate;

removing a portion of the insulating layer to form a contact hole which exposes an upper surface of the source/drain region;

forming a first polysilicon layer at least at a periphery of the contact hole and on the upper surface of the source/drain region; and forming a second polysilicon layer on an upper surface of the first polysilicon layer, using an anisotropical silicon selective growth technique.

2. A method as claimed in claim 1, wherein the insulating layer is a silicon dioxide layer.

3. A method as claimed in claim 1, wherein the insulating layer is formed, using chemical vapor deposition.

4. A method as claimed in claim 1, wherein said step of forming the first polysilicon layer includes the steps of:

forming a polysilicon layer over the substrate;

implanting ions into the polysilicon layer; and patterning the polysilicon layer, using a photolithography and etching technique, so that the polysilicon layer is at the periphery of the contact hole and on the upper surface of the source/drain region.

5. A method as claimed in claim 4, wherein the polysilicon layer is formed by chemical vapor deposition and has a thickness of about 300 to 500 Å.

6. A method as claimed in claim 4, wherein the ions are the first conductivity type ions and the ions are implanted into the polysilicon layer at an energy level of about 30–50 KeV, with a dosage of about $1\times10^{15}$ cm$^{-2}$ to $3\times10^{15}$ cm$^{-2}$.

7. A method as claimed in claim 4, wherein the polysilicon layer is patterned, using photolithography and an etching technique with a flush recipe.

8. A method as claimed in claim 4, wherein the polysilicon layer is patterned, using photolithography and an etching technique without a flush recipe.

9. A method as claimed in claim 1, wherein the anisotropical silicon selective growth technique is performed in a cold wall ultra-high vacuum chemical vapor deposition system under the following conditions:

a base pressure of about $8\times10^{-1}$ Torr;

a $Si_2H_6$ flow rate of about 1 sccm; and a total pressure of about $1\times10^{-3}$ Torr.

* * * * *